United States Patent
Leobandung

(10) Patent No.: US 10,326,004 B1
(45) Date of Patent: Jun. 18, 2019

(54) DOUBLE PATTERNING EPITAXY FIN

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/848,544

(22) Filed: Dec. 20, 2017

(51) Int. Cl.
  *H01L 29/66* (2006.01)
  *H01L 29/78* (2006.01)

(52) U.S. Cl.
  CPC ...... *H01L 29/66795* (2013.01); *H01L 29/785* (2013.01)

(58) Field of Classification Search
  None
  See application file for complete search history.

(56) References Cited

U.S. PATENT DOCUMENTS

| | | | |
|---|---|---|---|
| 7,547,640 B2 * | 6/2009 | Abatchev | H01L 21/0332 257/E21.49 |
| 9,735,258 B2 * | 8/2017 | Balakrishnan | H01L 21/845 |

* cited by examiner

*Primary Examiner* — Telly D Green
(74) *Attorney, Agent, or Firm* — L. Jeffrey Kelly, Esq.; Hoffmann & Baron, LLP

(57) ABSTRACT

A method is provided for use in forming a fin of a FinFET for an integrated circuit. The method comprises the steps of forming a hard mask on a substrate; forming an opening in the hard mask with a portion of the substrate exposed therein; forming a buffer on the exposed substrate within the opening in the hard mask; forming a mandrel at least in part on the buffer within the opening in the hard mask; forming a channel on a top and sides of the mandrel; removing the channel formed on the top of the mandrel without removing the channel formed on the sides of the mandrel; and removing the mandrel without removing the channel formed on the sides of the mandrel.

15 Claims, 10 Drawing Sheets

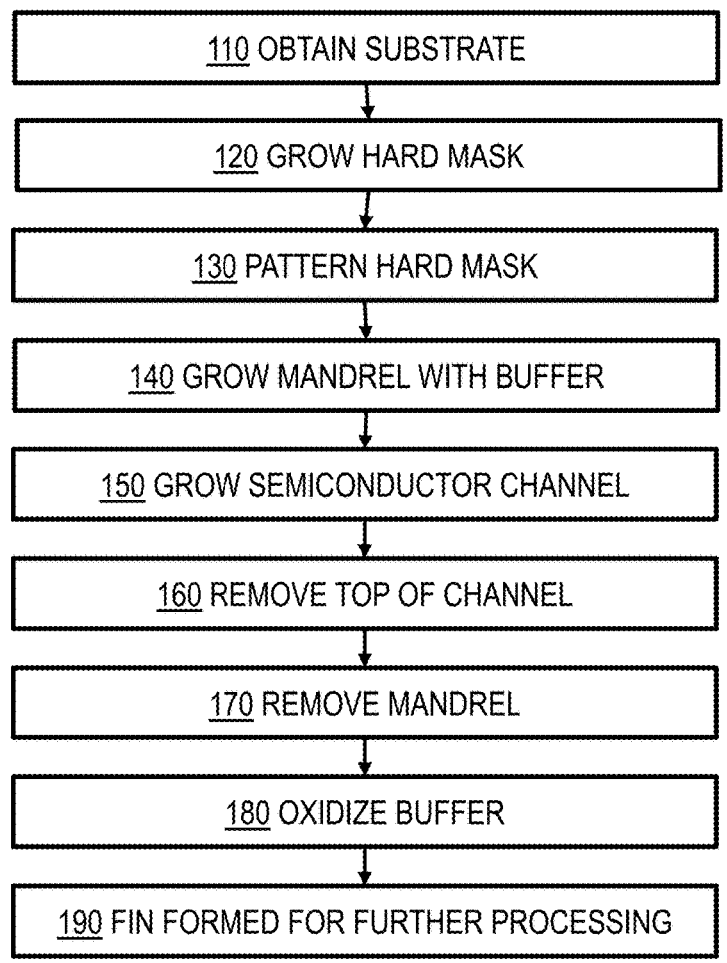

DOUBLE PATTERNING EPITAXY FIN

BACKGROUND

The present invention relates to the electrical, electronic, and computer arts, and, more particularly, to methods for forming fins in integrated circuits comprising FinFETs.

Multi-gate field-effect transistors (FETs) are of considerable interest because of their superior electrostatic integrity, as well as their promise of lower supply voltages, reduced threshold voltages, and extended scalability. FinFETs are one form of such multi-gate device. In a FinFET, a narrow channel feature (i.e., fin) is raised above the substrate and passes under a gate, which effectively wraps around the fin. The gate is thereby capacitively coupled to the top as well as the sides of the fin. So structured, very little leakage current passes through channel portions of the fin when the device is in the off state. This allows the use of lower threshold voltages and higher switching speeds.

SUMMARY

Embodiments of the invention provide a means for cutting fins in integrated circuits with FinFETs so as to isolate one transistor device from another. Advantageously, the cut may be accomplished in about the width of a gate, making the process extremely space-efficient. Moreover, the ends of the cut fin portions may be terminated in sidewall spacers that both electrically isolate these fin portions, as well as protect them during further processing.

Aspects of the invention are directed to a method for use in forming a fin of a FinFET for an integrated circuit. The method comprises the steps of forming a hard mask on a substrate; forming an opening in the hard mask with a portion of the substrate exposed therein; forming a buffer on the exposed substrate within the opening in the hard mask; forming a mandrel at least in part on the buffer within the opening in the hard mask; forming a channel on a top and sides of the mandrel; removing the channel formed on the top of the mandrel without removing the channel formed on the sides of the mandrel; and removing the mandrel without removing the channel formed on the sides of the mandrel.

Additional aspects of the invention are directed to a FinFET formed at least in part using a method like that set forth in the previous paragraph.

Further aspects of the invention are directed to a structure for use in a fin of a FinFET. The structure includes a hard mask formed on a substrate. The hard mask has an opening with at least a portion of the substrate exposed therein. The structure also includes a buffer formed on the portion of the substrate exposed within the hard mask; and a plurality of channels formed on the substrate proximate to respective sides of the opening.

BRIEF DESCRIPTION OF THE SEVERAL VIEWS OF THE DRAWINGS

These and other features, aspects, and advantages of the present invention will become better understood with regard to the following description, appended claims, and accompanying drawings where:

FIG. 1 shows a method for forming a fin, in accordance with an illustrative embodiment of the invention;

Figure 2A:
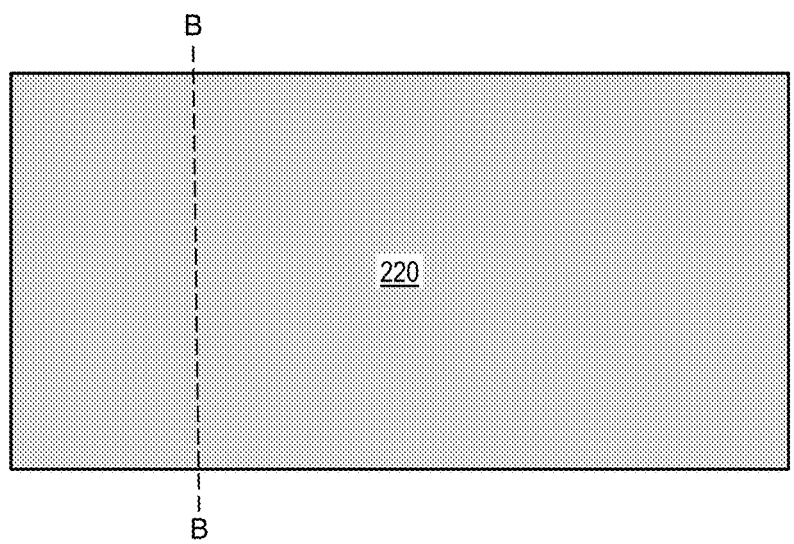
FIGS. 2A and 2B, 3A and 3B, 4A and 4B, 5A and 5B, 6A and 6B, 7A and 7B, 8A and 8B, and 9A through 9C, are top plan views ("A") and corresponding cross-sectional views ("B" and "C") depicting intermediate processing steps in an overall method for forming a fin, according to one or more embodiments of the invention.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments. In the sectional views included herein, features present behind the sectional planes are not shown to reduce clutter and enhance clarity.

DETAILED DESCRIPTION

Principles of the present disclosure will be described herein in the context of an illustrative fin structure, and processing methods for forming same. It is to be appreciated, however, that the specific structures and/or methods illustratively shown and described herein are to be considered exemplary as opposed to limiting. Moreover, it will become apparent to those skilled in the art given the teachings herein that numerous modifications can be made to the embodiments shown that are within the scope of the appended claims. That is, no limitations with respect to the embodiments shown and described herein are intended or should be inferred. It is emphasized that while some individual processing steps may be set forth herein, those steps are merely illustrative, and one skilled in the art may be familiar with several equally suitable alternatives that would also fall within the scope of the invention.

It is to be appreciated that the various layers, regions and/or components shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

FIG. 1 shows a flow diagram of a method 100 for forming a fin in a FinFET, in accordance with an illustrative embodiment of the invention. Although the method 100 and the structures formed thereby are entirely novel, many of the individual processing steps required to implement the method 100 may utilize conventional semiconductor fabrication techniques and conventional semiconductor fabrication tooling. These techniques and tooling will already be familiar to one having ordinary skill in the relevant arts given the teachings herein. Moreover, details of the individual processing steps used to fabricate semiconductor devices described herein may be found in a number of publications, for example, S. Wolf and R. N. Tauber, *Silicon Processing for the VLSI Era, Volume* 1, Lattice Press, 1986; S. Wolf, *Silicon Processing for the VLSI Era, Vol. 4: Deep-Submicron Process Technology*, Lattice Press, 2003; and S. M. Sze, *VLSI Technology, Second Edition*, McGraw-Hill, 1988, all of which are incorporated by reference herein. It is also emphasized that the descriptions provided herein are not intended to encompass all of the processing steps that may be required to successfully form a functional device. Rather, certain processing steps that are conventionally used in forming integrated circuit devices, such as, for example, wet cleaning steps, are purposefully not described herein for economy of description. However, one skilled in the art will readily recognize those processing steps omitted from this more generalized description. Structural and functional aspects of FinFETs are described in J. G. Fossum et al., *Fundamentals of Ultra-Thin-Body MOSFETs and FinFETs*, Cambridge University Press, 2013, which is also hereby incorporated by reference herein.

Figure 2B:
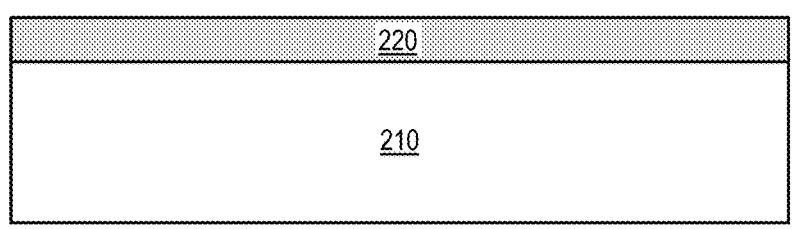

After obtaining a substrate in step 110 of FIG. 1, FIGS. 2A and 2B show an exemplary device after performing step 120 of method 100 shown in FIG. 1. FIG. 2A is a top plan view, while FIG. 2B is a cross-sectional view along axis "B" in FIG. 2A. In step 120, a hard mask 220 is formed on a substrate 210, such as by a growth process (e.g., oxidation). The substrate 210 may be silicon (e.g., bulk silicon), but it can also be another crystalline material such as germanium (Ge), silicon carbide (SiC), or III-V compounds, while hard mask 220 may be an oxide grown from the substrate 210. For example, where substrate 210 is silicon, hard mask 220 may be silicon dioxide ($SiO_2$). The hard mask 220 may be grown to a height of, for example, approximately 20-100 nanometers (nm).

Figure 3A:
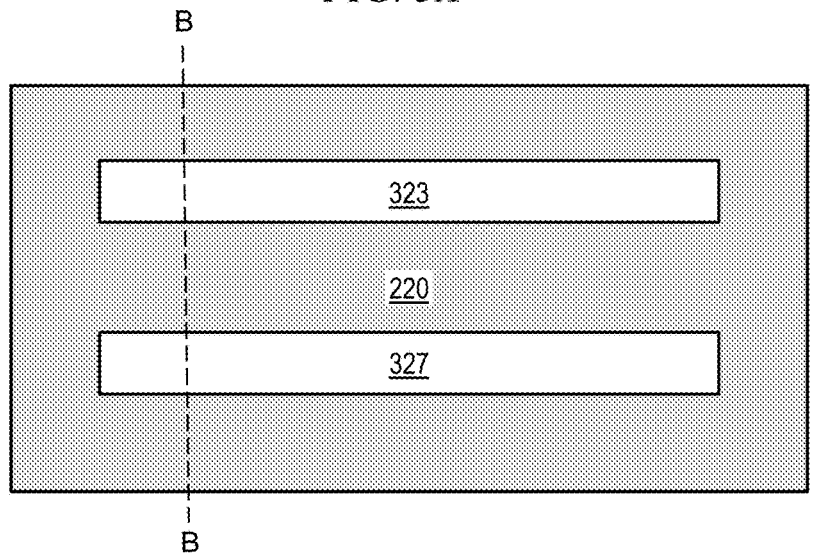
Figure 3B:
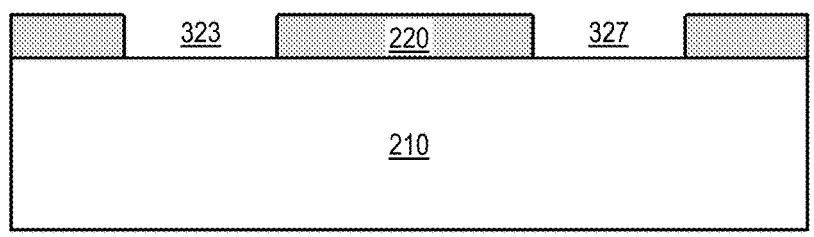

FIGS. 3A and 3B show an exemplary device after performing step 130 of method 100 shown in FIG. 1. FIG. 3A is a top plan view, while FIG. 3B is a cross-sectional view along axis "B" in FIG. 3A. In step 130, hard mask 220 is patterned, such as, for example, using standard photolithography. Hard mask 220 may be patterned with 2x pitch, thus creating openings 323 and 327 in hard mask 220, where substrate 210 is exposed. Openings 323 and 327 may have a width (e.g., parallel to axis B) of, for example, 10-50 nanometers (nm). Hard mask 220 may be patterned to have a <110> surface or another surface. Openings 323 and 327 may comprise trenches, with the orientation perpendicular to the trench width (e.g., short axis) being on <111> direction or another direction.

Figure 4A:
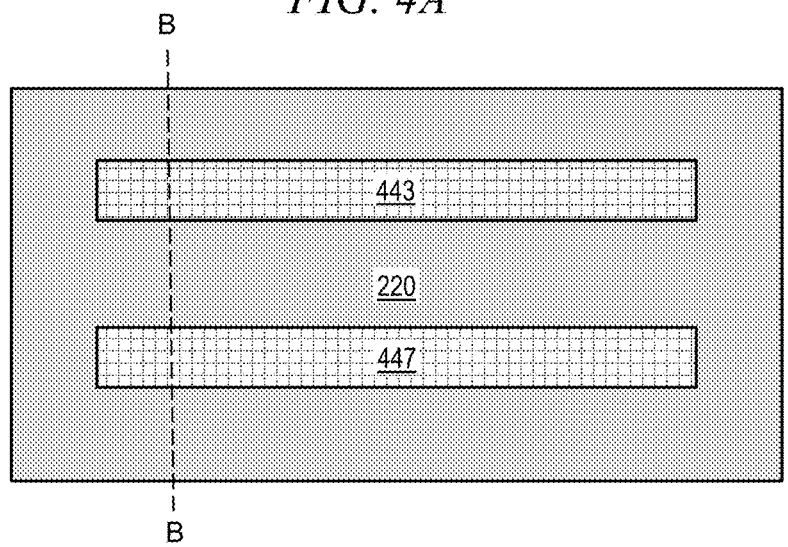
Figure 4B:
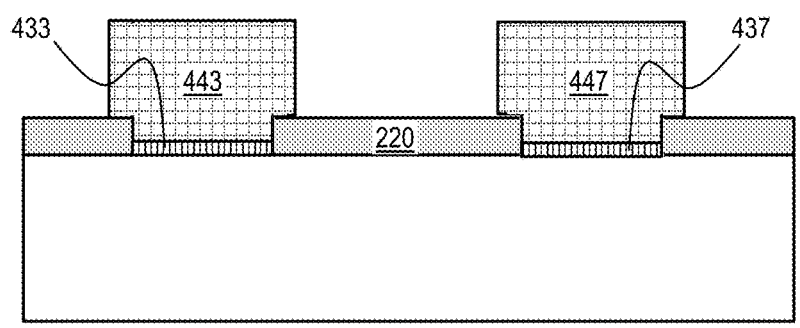

FIGS. 4A and 4B show an exemplary device after performing step 140 of method 100 shown in FIG. 1. FIG. 4A is a top plan view, while FIG. 4B is a cross-sectional view along axis "B" in FIG. 4A. In step 140, mandrels are grown with buffers on the patterned bulk silicon. Buffers 433 and 437 are grown or deposited on substrate 210 through openings 323 and 327. In FIG. 4B, buffers 433 and 437 only partially fill openings 323 and 327, because the height of the buffers 433 and 437 is less than the height of the hard mask 220. Buffers 433 and 437 may have a height of, for example, approximately 10-50 nanometers (nm), which may be approximately half the height of hard mask 220. Buffers 433 and 437 may, in one or more embodiments, comprise a III-V semiconductor material, and more particularly a binary compound, such as aluminum arsenide (AlAs), represented by widely-spaced vertical lines.

Mandrels 443 and 447 are grown (e.g., through epitaxy) on buffers 433 and 437 to fill the remainder of openings 323 and 327. Mandrels 443 and 447 also expand beyond openings 323 and 327 both horizontally (e.g., deposited upon mask 220) and vertically (e.g., to a height exceeding that of hard mask 220). Mandrels 443 and 447 may be grown to a height of, for example, approximately 30-50 nanometers (nm) above the hard mask 220. Mandrels 443 and 447 may be grown to a width of, for example, approximately 20-60 nanometers (nm), which may be approximately 10 nanometers (nm) greater than the width of the openings 323 and 327. Mandrels 443 and 447 may comprise a III-V compound semiconductor material, and more particularly a binary compound, such as indium phosphide (InP).

Figure 5A:
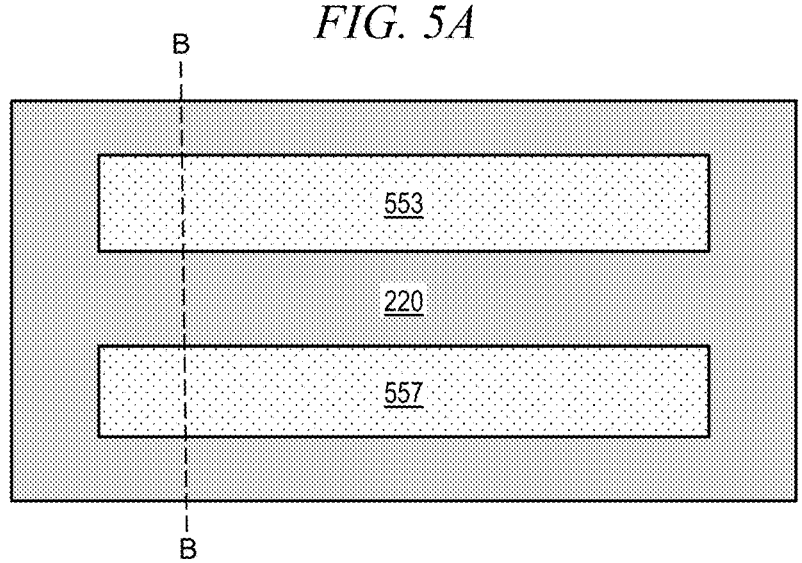
Figure 5B:
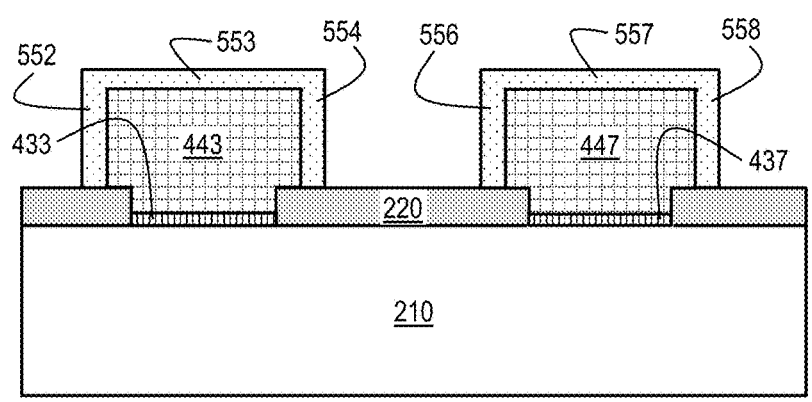

FIGS. 5A and 5B show an exemplary device after performing step 150 of method 100 shown in FIG. 1. FIG. 5A is a top plan view, while FIG. 5B is a cross-sectional view along axis "B" in FIG. 5A. In step 150, semiconductor channel material is grown (e.g., through epitaxy) on each mandrel. The semiconductor channel material may comprise a III-V semiconductor material, and more particularly a ternary alloy, such as indium gallium arsenide (InGaAs). The semiconductor channel material may be deposited on all surfaces of each mandrel to a depth of, for example, about 5-10 nm. Thus, the semiconductor channel material which is deposited on mandrel 443 includes side portions 552 and 554, as well as top portion 553. Similarly, the semiconductor channel material which is deposited on mandrel 447 includes side portions 556 and 558, as well as top portion 557.

Figure 6A:
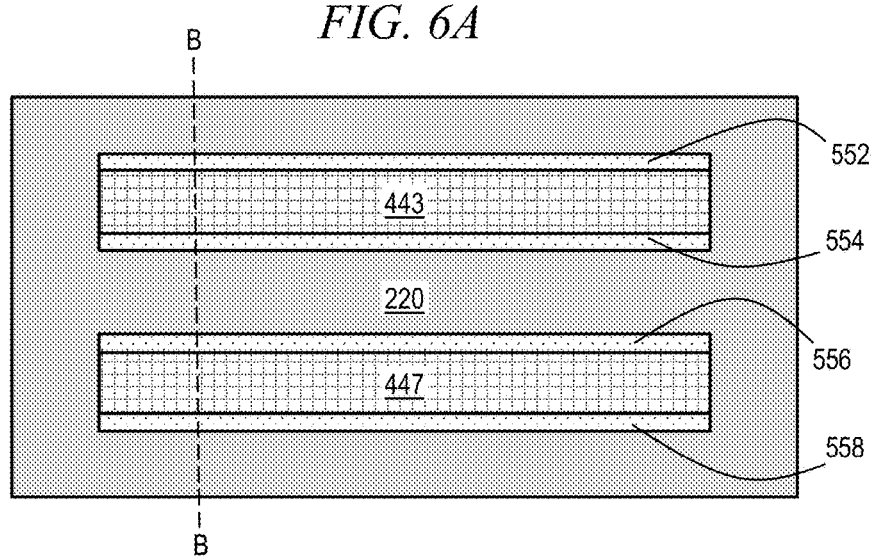
Figure 6B:
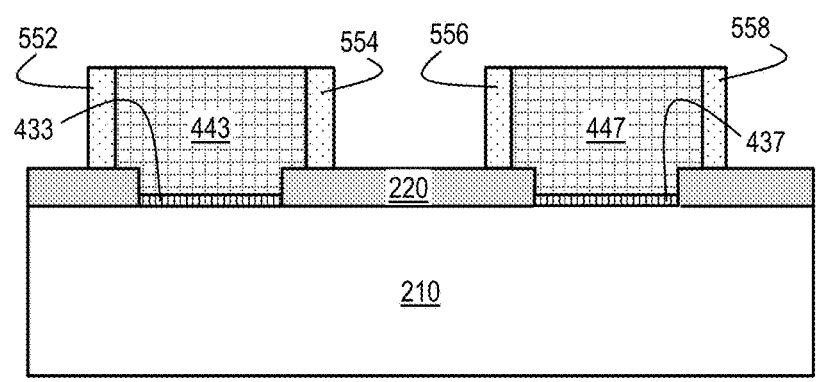

FIGS. 6A and 6B show an exemplary device after performing step 160 of method 100 shown in FIG. 1. FIG. 6A is a top plan view, while FIG. 6B is a cross-sectional view along axis "B" in FIG. 6A. In step 160, the top portion of the semiconductor channel (e.g., InGaAs) is removed. This may involve an anisotropic etch, such as reactive ion etching (ME). Alternatively, this may involve planarization followed by mechanical processing, such as chemical mechanical processing (CMP). Top portion 553 is removed, exposing mandrel 443, and top portion 557 is removed, exposing mandrel 447. However, side portions 552 and 554 remain around mandrel 443, and side portions 556 and 558 remain around mandrel 447.

Figure 7A:
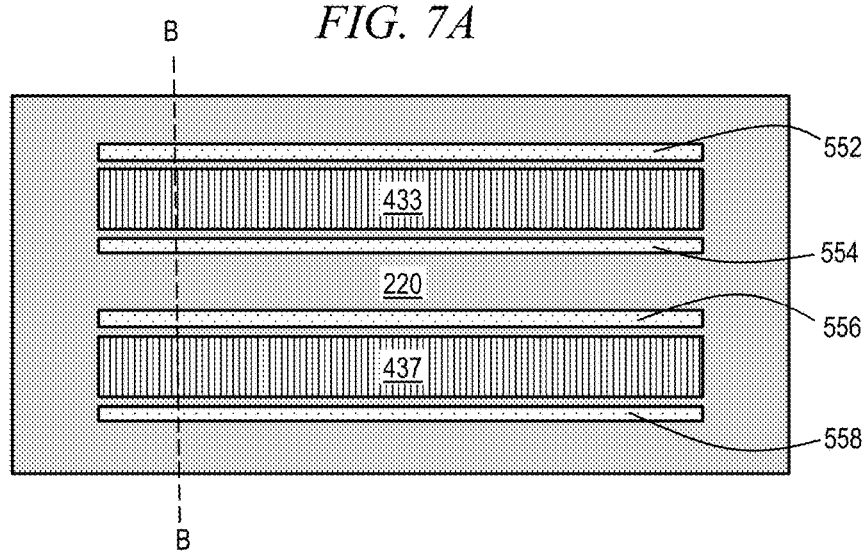
Figure 7B:
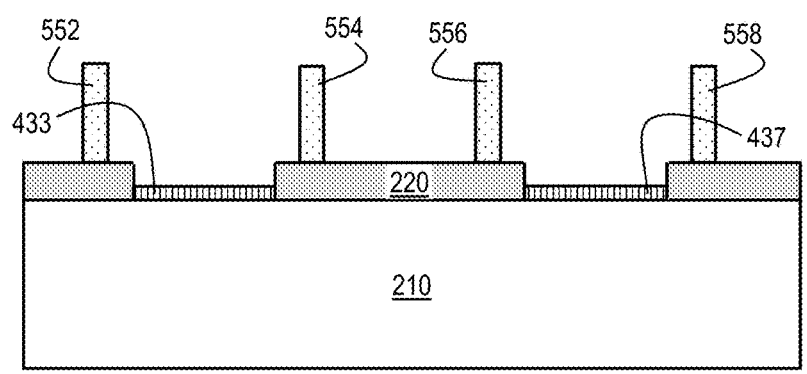

FIGS. 7A and 7B show an exemplary device after performing step 170 of method 100 shown in FIG. 1. FIG. 7A is a top plan view, while FIG. 7B is a cross-sectional view along axis "B" in FIG. 7A. In step 170, the mandrels 443 and 447 is removed. This may include an isotropic etch, such as a wet etch, which may be selective to the materials comprising the semiconductor channels and buffers. Thus, for example, the isotropic etch may be a wet etch selective to InGaAs (e.g., the semiconductor channels) and AlAs (e.g., the buffers). Thus, mandrels 443 and 447 are removed, while buffers 433 and 437 and semiconductor channel portions 552, 554, 556, and 558 remain. The lateral distance between semiconductor channel portions 552, 554, 556 and 558 and the buffers 433 and 437 corresponds to the width of the respective portions of mandrels 443 and 447 which was formed on hard mask 220 rather than on buffers 433 and 437.

Figure 8A:
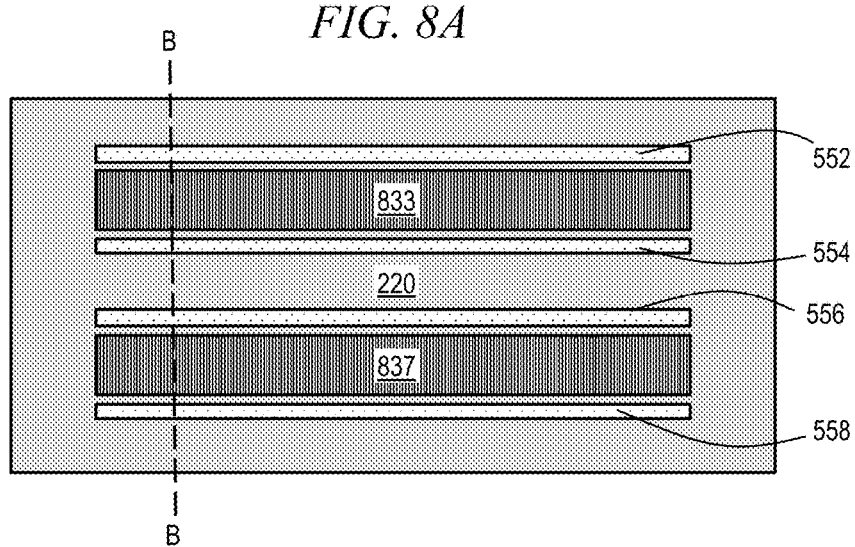
Figure 8B:
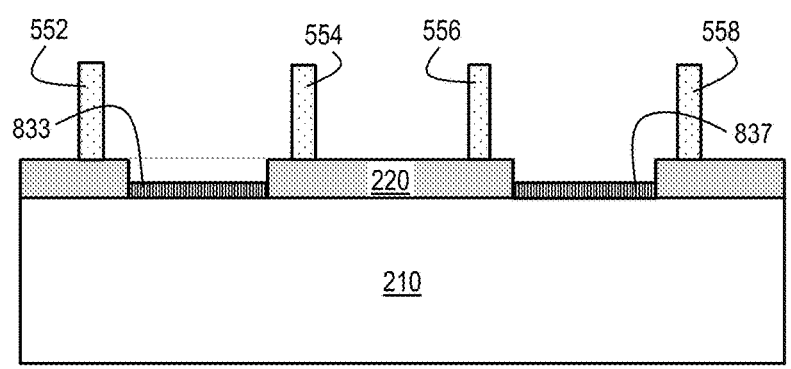

FIGS. 8A and 8B show an exemplary device after performing step 180 of method 100 shown in FIG. 1. FIG. 8A is a top plan view, while FIG. 8B is a cross-sectional view along axis "B" in FIG. 8A. In step 180, the buffers are oxidized to convert the semiconductor to an insulator. For example, the aluminum arsenide (AlAs) in buffers 433 and 447 can be oxidized to form aluminum oxide ($Al_2O_3$) in buffers 833 and 837, represented by narrowly-spaced vertical lines.

Figure 9A:
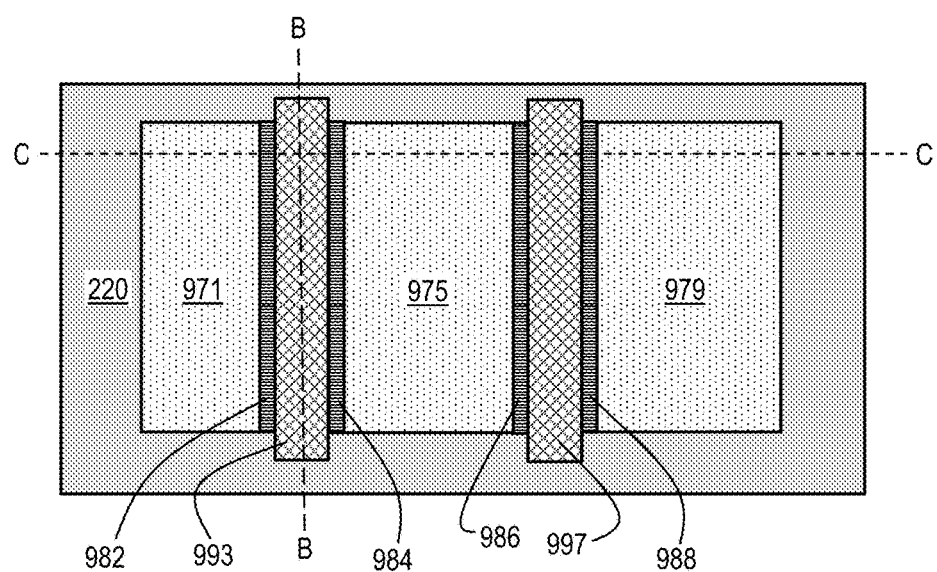
Figure 9B:
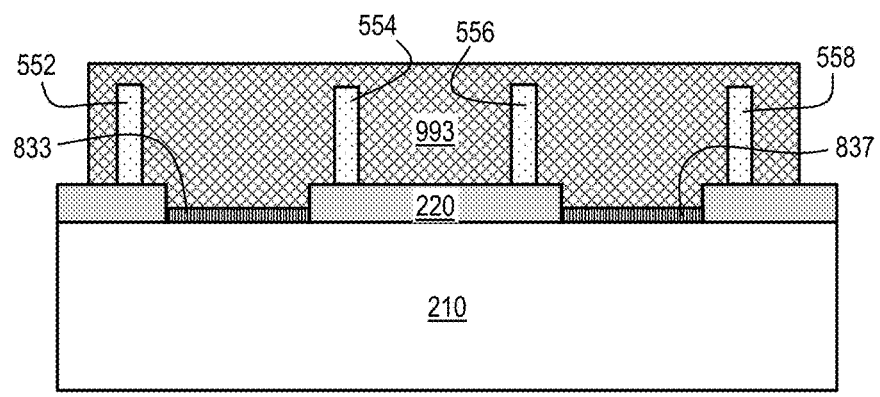
Figure 9C:
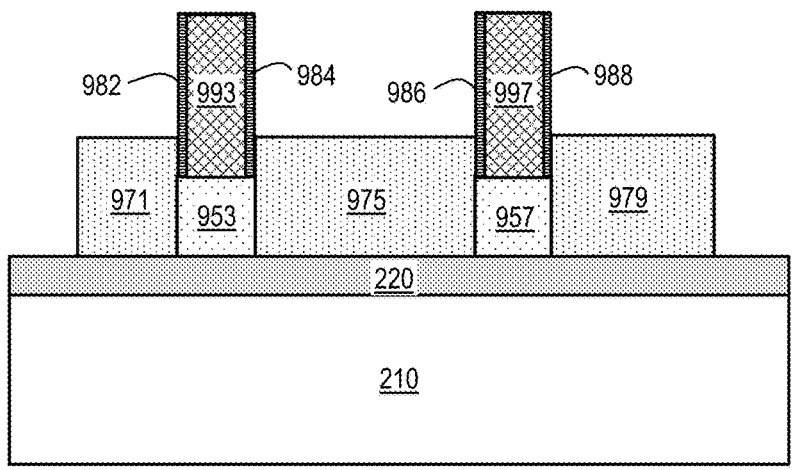

FIGS. 9A-9C show an exemplary device after performing step 190 of method 100 shown in FIG. 1. FIG. 9A is a top plan view, while FIGS. 9B and 9C are cross-sectional views along axes "B" and "C," respectively, in FIG. 9A. In step 190, fins may be at least partially formed, and the device may be ready for further processing. Note that axis "C" is orthogonal to axis "B" in FIG. 9A: axis "B" is parallel to a fin comprising gate region 993, while axis "C" is orthogonal to the fin comprising gate region 993.

In FIGS. 9A-9C, first and second fins may comprise respective semiconductor regions 953 and 957, which may be formed from, and/or include at least a portion of, the semiconductor channels 552, 554, 556, and 558. Thus, semiconductor regions 953 and 957, like semiconductor channels 552, 554, 556 and 558, may be formed on hard mask 220 and may comprise indium gallium arsenide (InGaAs). Gate regions 993 and 997, which may include gate dielectric and/or conductive material (e.g., gate metal), may be formed on semiconductor regions (e.g., 953 and 957 and/or 552, 554, 556, and 558) within the respective fins.

Source/drain epitaxy layers 971, 975, 979 may be formed on hard mask layer 220 and may surround the fins along one or more axes. Spacers 982, 984, 986, and 988 are formed around gate regions 993 and 997 to physically separate and electrically isolate gate regions 993 and 997 from the source/drain epitaxy layers 971, 975, 979. Within respective fins, source/drain epitaxy layers 971, 975 and 975 are higher than semiconductor regions (e.g., 953 and 957 and/or 552, 554, 556, and 558), however the gate regions (993 and 997) and spacers (982, 984, 986, and 988) are formed such that at least respective portions thereof are higher than, and thus protrude above, source/drain epitaxy layers 971, 975 and 975.

Thus, a first fin comprising semiconductor region 953 is between source/drain epitaxy layers 971 and 975, such that at least a portion of semiconductor region 953 is in electrical contact with source/drain epitaxy layers 971 and 975. Within the first fin, gate region 993 is formed over semiconductor region 953, and has a portion which is higher than source/drain epitaxy layers 971 and 975. However, within the first fin, gate region 993 is physically separated and electrically isolated from source/drain epitaxy layer 971 by spacer 982, respectively, while gate region 993 is physically separated and electrically isolated from source/drain epitaxy layer 971 by spacer 984.

A second fin comprising semiconductor portion 957 is between source/drain epitaxy layers 975 and 979, such that at least a portion of semiconductor region 953 is in electrical contact with source/drain epitaxy layers 971 and 975. Thus, source/drain epitaxy layer 975 is formed between the first and second fins. Within the second fin, gate region 997 is formed over semiconductor region 957, and has a portion which is higher than source/drain epitaxy layers 975 and 979. However, within the first fin, gate region 997 is physically separated and electrically isolated from source/drain epitaxy layer 975 by spacer 986, respectively, while gate region 997 is physically separated and electrically isolated from source/drain epitaxy layer 979 by spacer 988.

FIG. 9B shows a cross-section along axis "B" shown in FIG. 9A, which runs parallel to the first fin comprising gate region 993. Thus, gate region 993 is formed the semiconductor channels 552, 554, 556, and 558, at least a portion of which may comprise at least a portion of semiconductor region 953 shown in FIG. 9C. Moreover, gate region 993 is also formed over the oxidized buffers 833 and 837, as well as over portions of hard mask 220 adjacent to the semiconductor channels 552, 554, 556, and 558, and to the oxidized buffers 833 and 837.

Source/drain epitaxy layers 971 and 975 may be formed at least in part by implanting a dopant of a prescribed conductivity type and doping level, as is known in the art. Gate regions 993 and 997 are preferably self-aligning, and may be formed using processes such as, for example, gate-first (e.g., MIPS or metal inserted poly-silicon) and gate-last (e.g., RMG or replacement metal gate) technologies.

The methods described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input devices, and a central processor. These integrated circuits and end products would also fall within the scope of the invention.

It should again be emphasized that the above-described embodiments of the invention are intended to be illustrative only. Other embodiments may, for example, utilize different materials and processing steps from those expressly set forth above to achieve embodiments falling within the scope of the invention. These many alternative embodiments will be apparent to one having ordinary skill in the relevant arts. In other embodiments, for example, a FinFET may be formed with III-V materials, and a temporary layer modified to include an element that, when driven into a fin, allows a portion of that fin to be etched away with high selectivity to the surrounding structures.

All the features disclosed herein may be replaced by alternative features serving the same, equivalent, or similar purposes, unless expressly stated otherwise. Thus, unless expressly stated otherwise, each feature disclosed is one example only of a generic series of equivalent or similar features.

Any element in a claim that does not explicitly state "means for" performing a specified function or "step for" performing a specified function is not to be interpreted as a "means for" or "step for" clause as specified in AIA 35 U.S.C. § 112(f). In particular, the use of "steps of" in the claims herein is not intended to invoke the provisions of AIA 35 U.S.C. § 112(f).

What is claimed is:

1. A method for use in forming a fin of a FinFET for an integrated circuit, the method comprising the steps of:
   forming a hard mask on a substrate;
   forming an opening in the hard mask with a portion of the substrate exposed therein;
   forming a buffer on the exposed substrate within the opening in the hard mask;
   forming a mandrel at least in part on the buffer within the opening in the hard mask;
   forming a channel on a top and sides of the mandrel;
   removing the channel formed on the top of the mandrel without removing the channel formed on the sides of the mandrel; and
   removing the mandrel without removing the channel formed on the sides of the mandrel.

2. The method of claim 1, wherein the buffer, the mandrel, and the channel respectively comprise a first semiconductor material, a second semiconductor material, and a third semiconductor material.

3. The method of claim 1, wherein the mandrel comprises indium phosphide (InP), and wherein the channel comprises indium gallium arsenide (InGaAs).

4. The method of claim 1, wherein the buffer comprises a semiconductor material, the method further comprising the step of converting at least a portion of the semiconductor material to a dielectric material.

5. The method of claim 4, wherein the step of converting at least a portion of the semiconductor material to a dielectric material comprises oxidizing the buffer.

6. The method of claim 4, wherein the semiconductor material comprises aluminum arsenide (AlAs), and wherein the dielectric material comprises aluminum oxide ($Al_2O_3$).

7. The method of claim 1, wherein the hard mask comprises a first dielectric material and wherein the buffer comprises a semiconductor material, the method further comprising the step of converting at least a portion of the semiconductor material to a second dielectric material.

8. The method of claim 7, wherein the step of forming the hard mask on the substrate comprises oxidizing the substrate to form the first dielectric material, and wherein the step of converting at least a portion of the semiconductor material comprises oxidizing the buffer to form the second dielectric material.

9. The method of claim 7, wherein the first dielectric material comprises silicon dioxide ($SiO_2$), and wherein the second dielectric material comprises aluminum oxide ($Al_2O_3$).

10. The method of claim 1, wherein the buffer is formed on the exposed substrate to a height less than a height of the hard mask on the substrate.

11. The method of claim 1, wherein at least a portion of the mandrel extends laterally beyond the opening, said portion of the mandrel being formed on the hard mask.

12. The method of claim 1, wherein the channel formed on the sides of the mandrel is spaced laterally from the opening and the buffer therein.

13. The method of claim 1, wherein, after the mandrel is removed, the channel is spaced laterally from the opening and the buffer therein.

14. The method of claim 11, wherein, after the mandrel is removed, the channel is spaced laterally from the opening by a distance determined by said portion of the mandrel formed on the hard mask.

15. The method of claim 1, wherein forming the channel comprises epitaxially growing the channel at least in part from the mandrel, and wherein forming the mandrel comprises epitaxially growing the mandrel at least in part from the hard mask.

* * * * *